(12) United States Patent
Kang

(10) Patent No.: US 7,558,070 B2
(45) Date of Patent: Jul. 7, 2009

(54) ELECTRONIC INFORMATION STORAGE DEVICE

(75) Inventor: Yu-Cheng Kang, Jhonghe (TW)

(73) Assignee: A-Data Technology Co., Ltd., Taipei (TW)

( * ) Notice: Subject to any disclaimer, the term of this patent is extended or adjusted under 35 U.S.C. 154(b) by 0 days.

(21) Appl. No.: 12/081,323

(22) Filed: Apr. 15, 2008

(65) Prior Publication Data

US 2009/0091900 A1    Apr. 9, 2009

Related U.S. Application Data

(60) Provisional application No. 60/960,563, filed on Oct. 4, 2007.

(51) Int. Cl.
*H05K 7/14* (2006.01)

(52) U.S. Cl. .................. 361/752; 361/728; 361/730; 361/737; 439/131; 439/135

(58) Field of Classification Search .............. 361/754, 361/755, 741, 756, 728, 730, 737, 752, 736; 439/131, 135, 136; 174/520; 235/492
See application file for complete search history.

(56) References Cited

U.S. PATENT DOCUMENTS

| | | | |
|---|---|---|---|
| 6,902,333 B2 * | 6/2005 | Miyagawa et al. | 401/66 |
| 7,245,499 B2 * | 7/2007 | Stahl et al. | 361/754 |
| 7,407,393 B2 * | 8/2008 | Ni et al. | 439/131 |
| 7,466,556 B2 * | 12/2008 | Hiew et al. | 361/737 |
| 2006/0131431 A1 * | 6/2006 | Finn | 235/492 |
| 2008/0220636 A1 * | 9/2008 | Champion et al. | 439/131 |

* cited by examiner

*Primary Examiner*—Dameon E Levi
(74) *Attorney, Agent, or Firm*—Rosenberg, Klein & Lee

(57) ABSTRACT

An electronic information storage device includes a first casing provided with a first toothed portion; a pushing element; an outer gear coupled to the pushing element; and an electrical connecting portion having a circuit board mounting means and a circuit board, the circuit board mounting means being coupled to the circuit board, the circuit board mounting means being provided with a second toothed portion, wherein the outer gear is coupled to the first toothed portion and the second toothed portion respectively, so that the electrical connecting portion is driven with respect to the first casing when the pushing element pushes or pulls the outer gear. Via this arrangement, the moving distance of the electrical connecting portion can be further controlled, thereby improving the convenience of the storage device in use.

17 Claims, 7 Drawing Sheets

ELECTRONIC INFORMATION STORAGE DEVICE

REFERENCE TO RELATED APPLICATION

This Application is based on Provisional Patent Application Ser. No. 60/960,563, filed 4 Oct. 2007, currently pending.

BACKGROUND OF THE INVENTION

1. Field of the Invention

The present invention is related to a portable information storage device, which can be inserted in a computer to transmit data to and receive data from the computer.

2. Description of Related Art

FIGS. 1 and 2 show a conventional portable storage device, which includes a main body 1a, an electrical connector 2a, and a protective cover 3a. The main body 1a is provided therein with a circuit board (not shown). The electrical connector 2a is electrically connected with the circuit board. The electrical connector 2a is inserted into a connecting port of a computer, so that data can be transmitted between the storage device and a hard disk of the computer. When the storage device is not in use, the electrical connector 2a of the storage device is removed from the connecting port. Since the interior of the protective cover 3a has an accommodating space, the electrical connector 2a can be inserted into the accommodating space of the protective cover 3a to receive the electrical connector 2a in the protective cover 3a. At this time, the electrical connector 2a is protected by the protective cover 3a, and thus it will not collide with rigid articles directly and suffer damage.

However, each time when the storage device is used, it is inconvenient for the user to remove the protective cover 3a. Further, after the storage device is used, the user usually forgets to cover back the protective cover 3a or even lose the protective cover 3a Without the protection of the protective cover 3a, the electrical connector 2a may suffer damage when colliding with rigid articles.

Consequently, because of the above technical defects, the inventor keeps on carving unflaggingly through wholehearted experience and research to develop the present invention, which can effectively improve the defects described above.

SUMMARY OF THE INVENTION

In view of the above problems, the object of the present invention is to provide a portable electronic information storage device, which has a protecting effect and improves the convenience in use.

For achieving the object described above, the present invention provides an electronic information storage device, which includes: a first casing provided with a first toothed portion; a pushing element; an outer gear coupled to the pushing element; and an electrical connecting portion comprising a circuit board mounting means and a circuit board, the circuit board mounting means being coupled to the circuit board, the circuit board mounting means being provided with a second toothed portion, wherein the outer gear is coupled to the first toothed portion and the second toothed portion respectively, so that the electrical connecting portion is driven with respect to the first casing when the pushing element pushes or pulls the outer gear.

The present invention has advantageous effects as follows. When the pushing element pushes or pulls the outer gear, the electrical connecting portion will be driven with respect to the first casing. As a result, when the storage device is not in use, the user can retract the electrical connecting portion in the first casing. In this way, not only the electrical connecting portion can be protected, but also the moving distance of the electrical connecting portion can be further controlled via a proper design, thereby improving the convenience of the storage device in use.

DETAILED DESCRIPTION OF THE PREFERRED EMBODIMENTS

Figure 1:
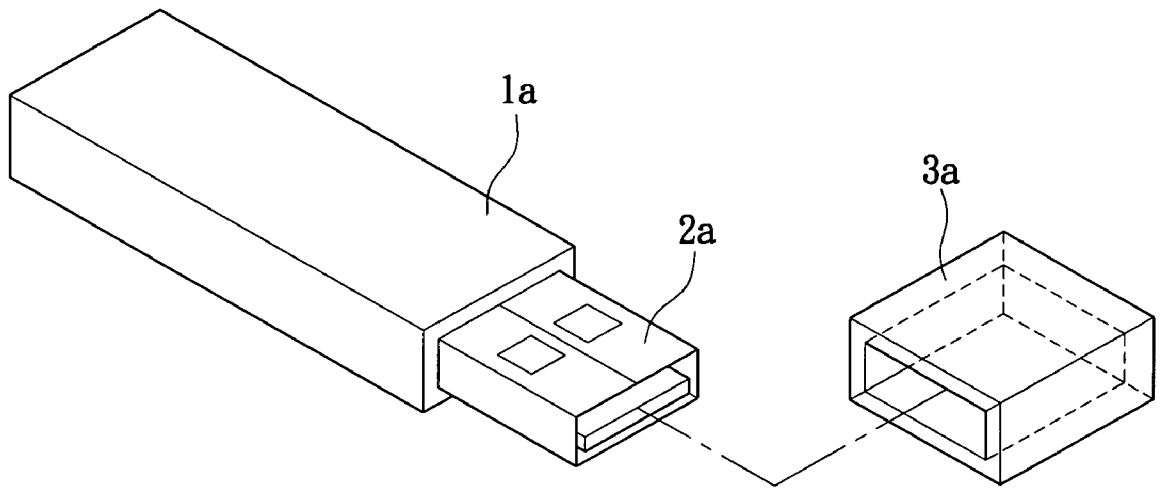
FIG. 1 is a schematic view showing a state of the conventional portable storage device.
Figure 2:
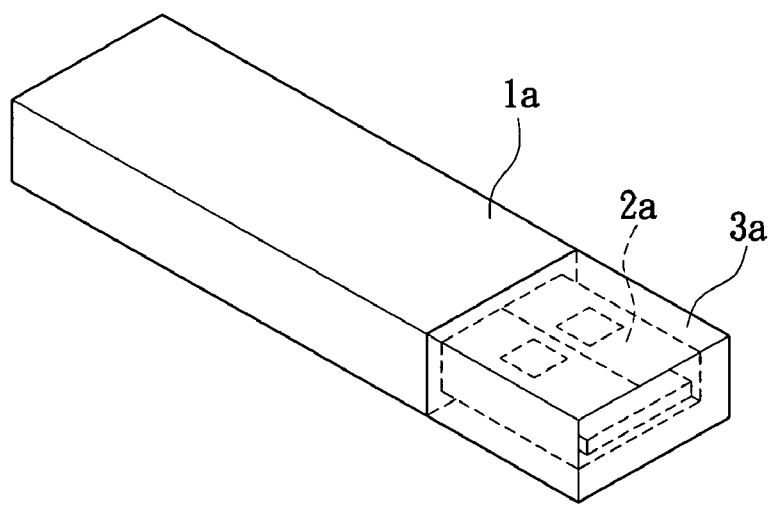
FIG. 2 is a schematic view showing another state of the conventional portable storage device.
Figure 3:
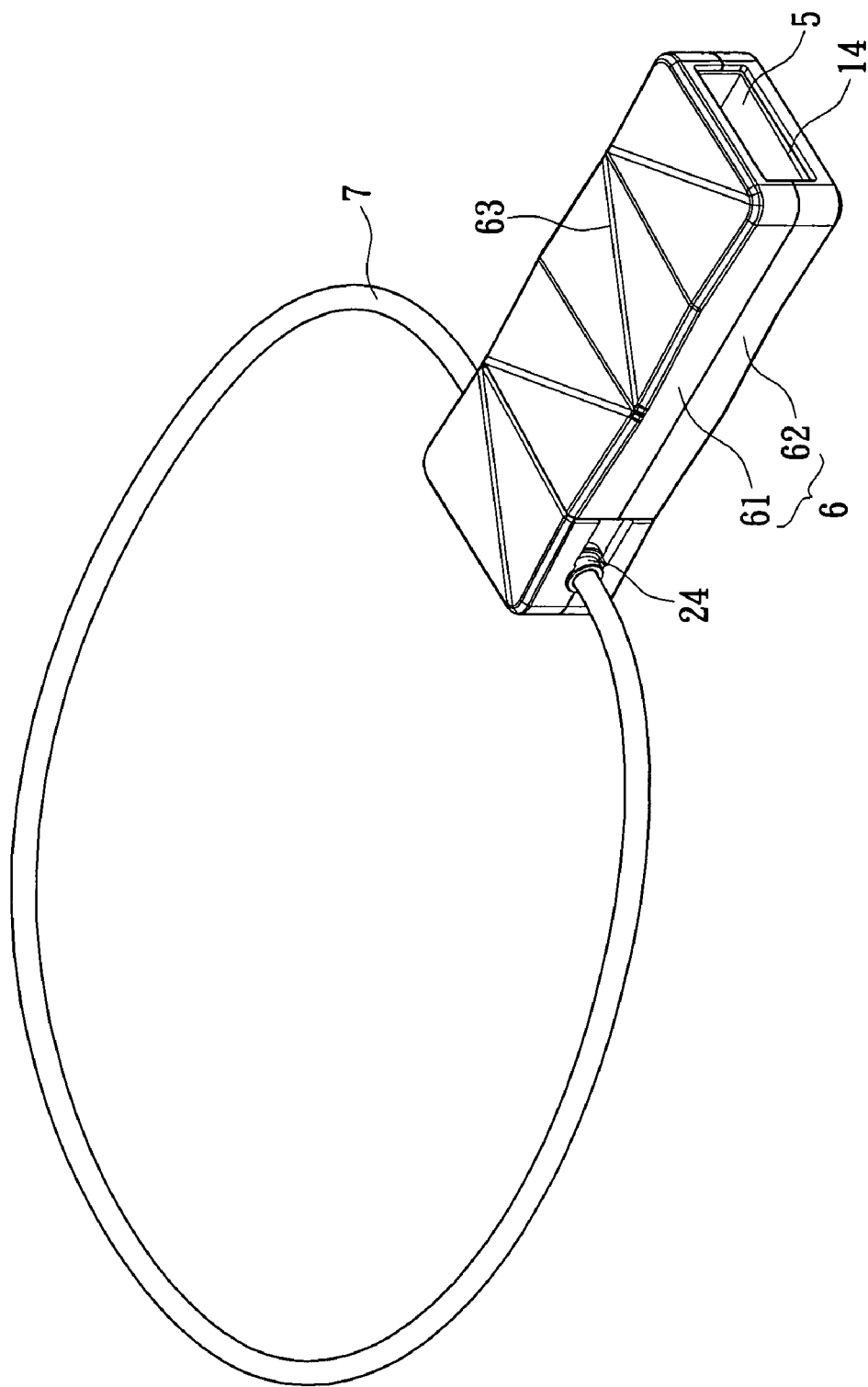
FIG. 3 is an assembled perspective view showing the electronic information storage device of the present invention.
Figure 4:
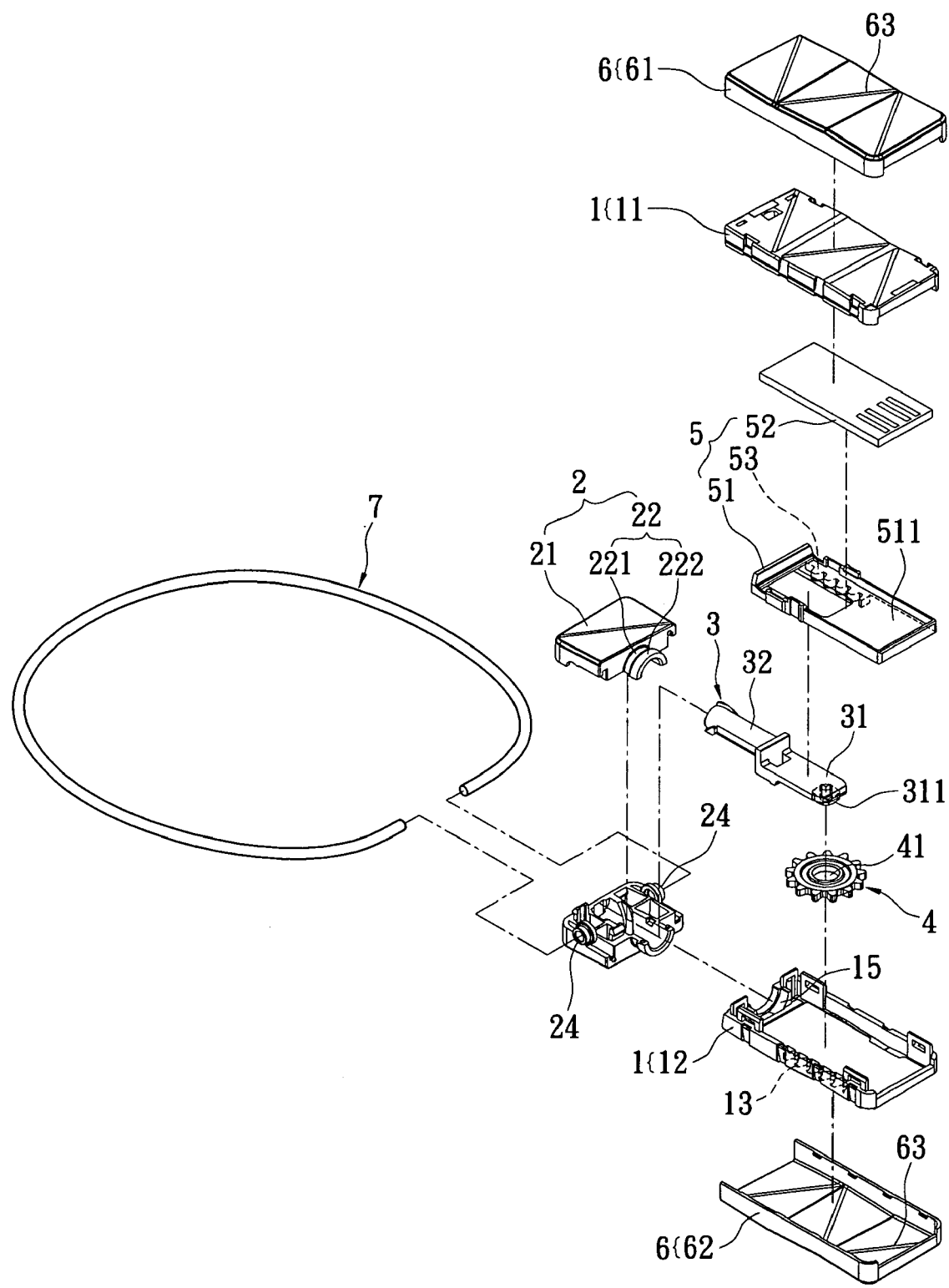
FIG. 4 is an exploded perspective view showing the electronic information storage device of the present invention.

Please refer to FIGS. 3 and 4. The present invention provides an electrical information storage device, which includes a first casing 1, a rotating means 2, a pushing element 3, an outer gear 4, an electrical connecting portion 5, and a protective casing 6. The first casing 1 is formed by assembling a top cover 1 with a base 12. The pushing element 3, the outer gear 4, and the electrical connecting portion 5 are accommodated between the top cover 11 and the base 12. An inner wall of the first casing 1 is provided with a first toothed portion 13. One end of the first casing 1 has an opening 14. The electrical connecting portion 5 movably penetrates through the opening 14. When the electrical connecting portion 5 is inserted into a connecting port of a computer, information can be transmitted between the computer and the storage device. The protective cover 6 is formed by assembling another top cover 61 and a bottom cover 62. The protective casing 6 covers the exterior of the first casing 1. The surface of the protective casing 6 is provided with oblique stripes 63 corresponding to the surface of the first casing 1, so that the first casing 1 and the protective casing 6 can be assembled quickly and easily by recognizing the stripes on the surface of the first casing 1 and the oblique stripes 63.

The rotating means 2 is connected to the exterior of the first casing 1. The rotating means 2 comprises a gripping portion 21 and a connecting portion 22. The connecting portion 22 comprises a first ring 221 and a second ring 222. The first ring 221 is connected to the gripping portion 21. The outer diameter of the first ring 221 is smaller than that of the second ring 222. The first ring 221 is connected between the gripping portion 21 and the second ring 222. The first casing 1 is provided with an accommodating portion 15. The first ring 221 and the second ring 222 are received in the accommodating portion 15. The inner wall of the gripping portion 21 is provided with internal threads. Two opposing sides outside the rotating means 2 are connected to a pivotal piece 24 respectively. The pair of pivotal pieces 24 is pivotally connected with a hanging ring 7 that allows the user to carry it about easily.

The pushing element 3 is coupled to the rotating means 2. Specifically, the pushing element 3 comprises a seat 31 and a screw rod 32. One side of the seat 31 is fixed to one end of the screw rod 32. The other side of the seat 31 is provided with a protruding block 311. The screw rod 32 penetrates the gripping portion 21, the first ring 221 and the second ring 222. The screw rod 32 is connected with the inner threads of the gripping portion 21.

The outer gear 4 is coupled to the pushing element 3. More specifically, the center of the outer gear 4 has an open hole 41, so that the outer gear 4 is pivotally connected to the protruding block 311 through the open hole 41 and thus the protruding block is coupled to the outer gear. One end of the outer gear 4 is engaged with the first toothed portion 13.

The electrical connecting portion 5 comprises a circuit board mounting means 51 and a circuit board 52 having memories, a memory controlling circuit and electrical connectors. The circuit board mounting means 51 is coupled to the circuit board 52. More specifically, the circuit board mounting means 51 is recessed to form a mounting trough 511, so that the circuit board 52 can be disposed in the mounting trough 511 and connected with the circuit board mounting means 51 firmly. The bottom surface of the circuit board mounting means 51 is provided with a second toothed portion 53. The other end of the outer gear 4 is coupled to the second toothed portion 53, so that the outer gear 4 is located between the first toothed portion 13 and the second toothed portion 53.

Figure 5:
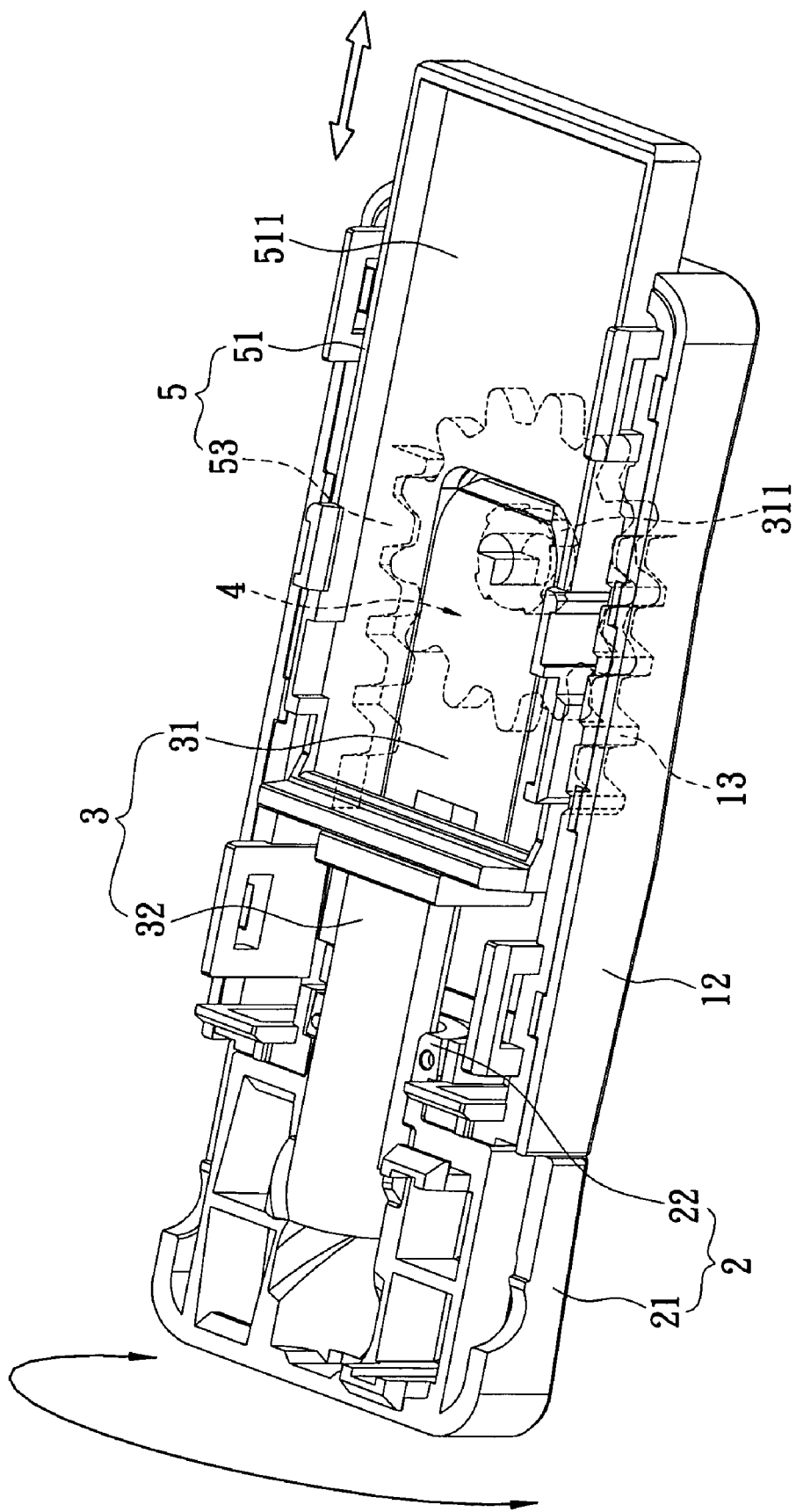
FIG. 5 is a schematic view showing the operation of the electronic information storage device of the present invention.

As shown in FIG. 5, when the storage device is in use, the user rotates the rotating means 2, so that the screw rod 32 received in the rotating means 2 moves with respect to the first casing 1. At this time, the seat 31 moves together with the screw rod 32, thus driving the outer gear 4. Since the outer gear 4 is engaged with the first toothed portion 13, the outer gear 4 can rotate and move with respect to the first casing 1, which drives the electrical connecting portion 5 engaged with the outer gear 4 via the second toothed portion 53 so as to move with respect to the first casing 1. More specifically, with the cooperation of the outer gear 4 with the first toothed portion 13 and the second toothed portion 53, since the outer gear 4 is pivotally connected to the pushing element 3 via the central open hole 41 having an inner radius $r_1$, when the pushing element 3 moves a distance of $D_1$ (e.g. 6 mm), the outer gear 4 also moves a distance of $D_1$. In the case that the outer radius of the outer gear 4 is $r_2$, since the first casing 1 is stationary to act like a fulcrum, the rotation of the outer gear 4 relative to the first casing 1 causes the electrical connecting portion 5 engaged with the outer gear 4 to move a distance of $D_2$, wherein $D_2=D_1\times(r_2/r_1)$. If the ratio of the outer radius to the inner radius of the outer gear 4 ($r_2/r_1$) is 2, the electrical connecting portion 5 can move a distance of 12 mm (6×2=12 mm). When the storage device is not in use, the user only has to rotate the rotating means 2 to retract the previously-protruding electrical connecting portion 5 into the first casing 1. In this way, the electrical connecting portion can be protected. Further, the moving distance of the electrical connecting portion 5 is multiplied by the ratio of the outer radius to the inner radius of the outer gear 4, which improving the convenience of the storage device in use.

Figure 6:
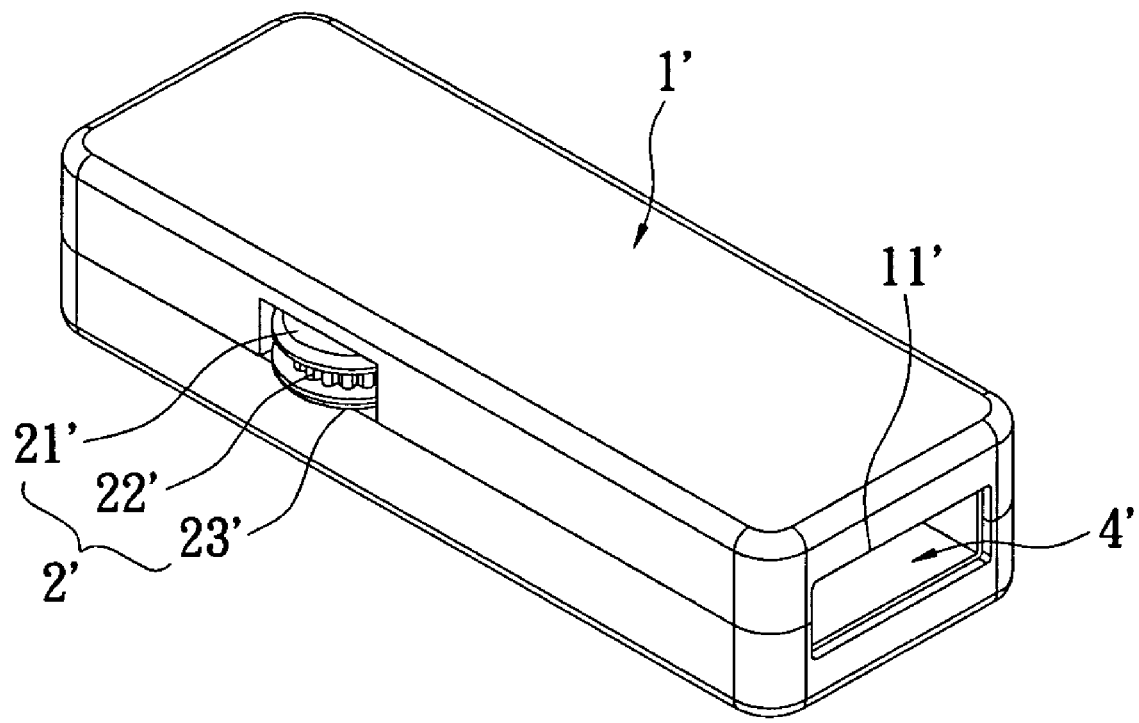
FIG. 6 is an assembled perspective view showing the second embodiment of the electronic information storage device of the present invention.
Figure 7:
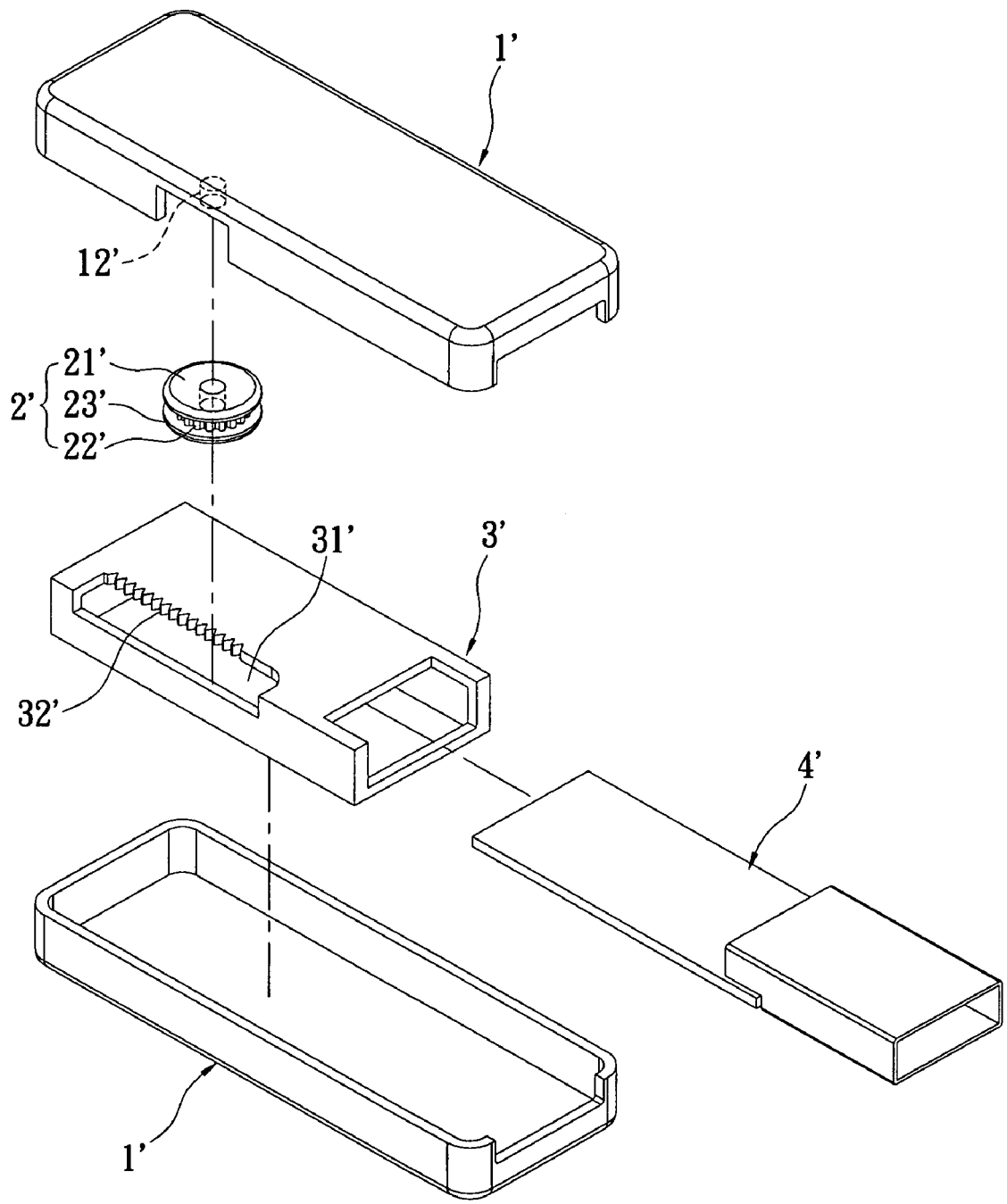
FIG. 7 is an exploded perspective view showing the second embodiment of the electronic information storage device of the present invention.

Please refer to FIGS. 6 and 7, which show another embodiment of the electrical information storage device of the present invention including a first casing 1', a rotating means 2', a pushing element 3', and a circuit board 4' having memories, a memory controlling circuit and electrical connectors. One end of the first casing 1' has an opening 11', and one side thereof is provided with a positioning pillar 12'. The rotating means 2 is coupled to the first casing 1'. The rotating means 2' has an upper cover 21', a first toothed portion 22' and a lower cover 23'. The first toothed portion 22' is circumferentially provided on the periphery of the rotating means 2'. The first toothed portion 22' is arranged between the upper cover 21' and the lower cover 23'. The upper cover 21', the first toothed portion 22' and the lower cover 23' are pivotally connected to the positioning pillar 12'. The side wall of the pushing element 3' is provided with a trough 31'. The pushing element 3' is provided with a second toothed portion 32' on the inner wall of the trough 31'. The rotating means 2' is located in the trough 31'. The first toothed portion 22' is engaged with the second toothed portion 32'. The circuit board 4' is coupled to an end surface outside the pushing element 3'. The circuit board 4' movably penetrates the opening 11'.

Figure 8:
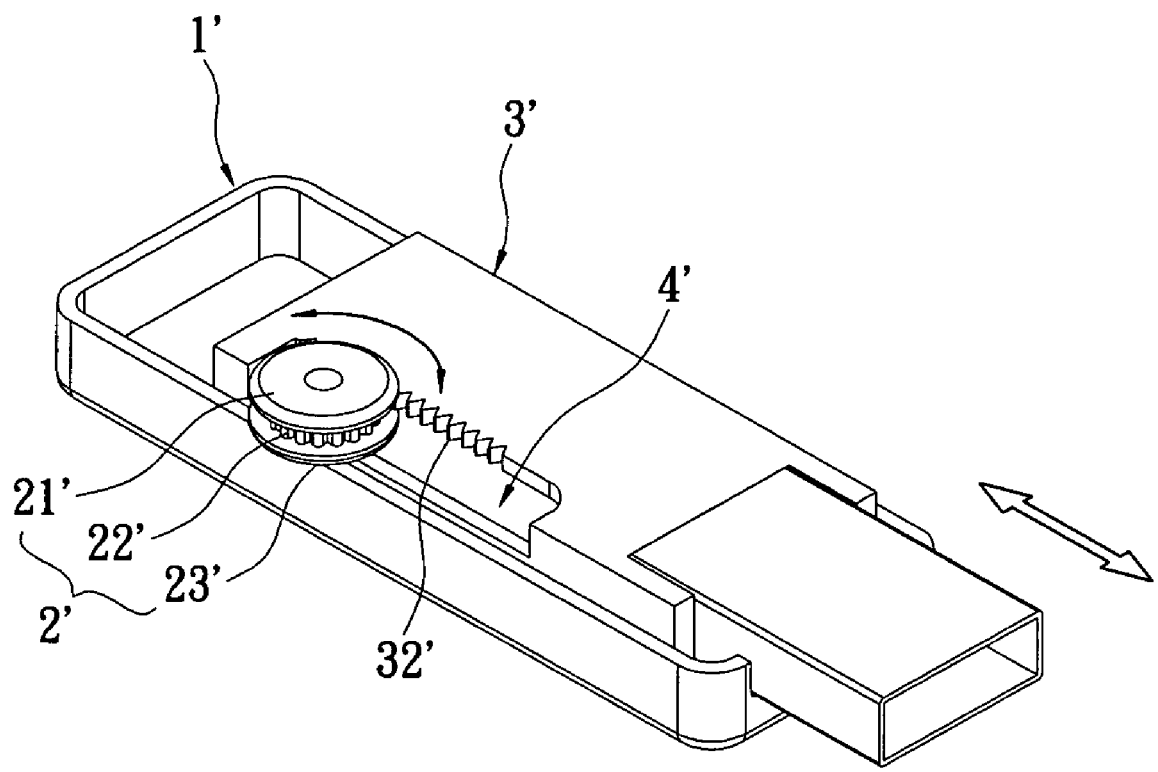
FIG. 8 is a schematic view showing the operation inside the second embodiment of the electronic information storage device of the present invention.

Please refer to FIG. 8. When the storage device is in use, the user can rotate the rotating means 2' to drive the pushing element 3' to move in the first casing 1' via the engagement between the first toothed portion 22' and the second toothed portion 32'. Then, the circuit board 4' coupled to the pushing element 3' moves together with the pushing element 3', and finally protrudes from the opening 11'. When the storage device is not in use, the user rotates the rotating means 2' to return its original position, thus retracting the previously-protruding circuit board 4' into the first casing 1'. In this way, the circuit board 4' can be protected, and the convenience of the storage device in use can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic information storage device, comprising:
a first casing provided with a first toothed portion;
a pushing element;
an outer gear coupled to the pushing element; and
an electrical connecting portion comprising a circuit board mounting means and a circuit board, the circuit board mounting means being coupled to the circuit board, the circuit board mounting means being provided with a second toothed portion, wherein the outer gear is coupled to the first toothed portion and the second toothed portion respectively, so that the electrical connecting portion is driven with respect to the first casing when the pushing element pushes or pulls the outer gear.

2. The electronic information storage device according to claim 1, further comprising a rotating means coupled to the pushing element, the rotation of the rotating means driving the pushing element to move with respect to the first casing.

3. The electronic information storage device according to claim 2, wherein the rotating means comprises a gripping portion and a connecting portion, the connecting portion is fixed to the gripping portion, the first casing has therein an accommodating portion, and the connecting portion is received in the accommodating portion.

4. The electronic information storage device according to claim 3, wherein the pushing element penetrates the connecting portion and the gripping portion.

5. The electronic information storage device according to claim 3, wherein the connecting portion comprises a first ring and second ring, the first ring is connected between the gripping portion and the second ring, the pushing element penetrates the first ring and the second ring.

6. The electronic information storage device according to claim 1, wherein the circuit board mounting means is recessed to form a mounting trough, and the circuit board is received in the mounting trough.

7. The electronic information storage device according to claim 1, wherein the center of the outer gear has an open hole, the outer gear is pivotally connected on the pushing element via the open hole.

8. An electronic information storage device, comprising:
a first casing having one side being provided with a positioning pillar;
a rotating means, with its periphery being circumferentially provided with a first toothed portion, the rotating means being pivotally coupled to the positioning pillar of the first casing;
a pushing element provided with a second toothed portion, the first toothed portion being coupled to the second toothed portion, the pushing element having one side being provided with a trough, and the second toothed portion being provided on an inner wall of the trough of the pushing element; and
a circuit board coupled to the pushing element, the pushing element driving the circuit board to move with respect to the first casing upon the rotation of the rotating means relative to the first casing.

9. The electronic information storage device according to claim 8, wherein the circuit board has memories and a memory controlling circuit arranged thereon to memorize information.

10. An electronic information storage device adapted for transmitting information into/from computer, comprising:
a casing with an opening;
a pushing element movably mounted in the casing;
an outer gear rotatably engaged with the pushing element and the casing;
an electrical connecting portion enclosed in the casing at its original position, the electrical connecting portion comprising a circuit board with memories, the electrical connecting portion engaged with the pushing element, whereby an rotatable movement of the outer gear drives the electrical connecting portion partly moving out the casing from the opening; and
a circuit board mounting means coupled to the circuit board and mounted in the casing, the circuit board mounting means being provided with a toothed portion, and the casing provided another toothed portion, wherein the outer gear is coupled to the first toothed portion and the second toothed portion respectively.

11. The electronic information storage device according to claim 10, further comprising a rotating means coupled to the pushing element to drive the pushing element to move with respect to the casing.

12. The electronic information storage device according to claim 10, wherein the pushing element comprises a protruding block, the outer gear being defined an open hole in its centre portion engaged with the protruding block pivotally.

13. The electronic information storage device according to claim 10, wherein the outer gear is inside the casing entirely.

14. The electronic information storage device according to claim 10, wherein the pushing element defines a trough at onside thereof, a toothed portion being provided on an inner wall of the trough to engage with the outer gear.

15. The electronic information storage device according to claim 14, wherein the casing comprises a positioning pillar engaged with the outer gear as a pivot, the out gear is partly inside the casing and partly outside the casing.

16. The electronic information storage device according to claim 1, wherein the circuit board has memories and a memory controlling circuit arranged thereon.

17. The electronic information storage device according to claim 7, wherein the open hole defines an inner radius $r_1$ and the outer gear defines an outer radius $r_2$, an outward movement of the pushing element with a distance of $D_1$ drives the electrical connecting portion moving outwardly with a distance $D_2$, wherein $D_2=D_1\times(r_2/r_1)$.

* * * * *